United States Patent
Tzeng et al.

(10) Patent No.: US 6,436,762 B1
(45) Date of Patent: Aug. 20, 2002

(54) METHOD FOR IMPROVING BIT LINE TO CAPACITOR ELECTRICAL FAILURES ON DRAM CIRCUITS USING A WET ETCH-BACK TO IMPROVE THE BIT-LINE-TO-CAPACITOR OVERLAY MARGINS

(75) Inventors: Kuo-Chyuan Tzeng, Chu-Pei; Tse-Liang Ying, Tainan; Min-Hsiung Chiang, Taipei; Hsiao-Hui Tseng, Tainan; Chung-Wei Chang, Hsin-chu, all of (TW)

(73) Assignee: Taiwan Semiconductor Manufactoring Company, Hsin-Chu (TW)

( * ) Notice: Subject to any disclaimer, the term of this patent is extended or adjusted under 35 U.S.C. 154(b) by 0 days.

(21) Appl. No.: 09/855,238

(22) Filed: May 14, 2001

(51) Int. Cl.[7] .................. M01L 21/8234; M01L 21/20
(52) U.S. Cl. .................. 438/253; 438/256; 438/254; 438/396
(58) Field of Search .................. 438/253, 255, 438/256, 396, 399, 239, 254; 257/400, 296, 306, 308

(56) References Cited

U.S. PATENT DOCUMENTS

| | | | |
|---|---|---|---|
| 5,150,276 A | * 9/1992 | Gonzalez et al. | 257/296 |
| 5,893,734 A | 4/1999 | Jeng et al. | 438/239 |
| 6,004,857 A | 12/1999 | Hsiao et al. | 438/396 |
| 6,077,738 A | 6/2000 | Lee et al. | 438/241 |
| 6,100,137 A | * 8/2000 | Chen et al. | 438/253 |
| 6,127,260 A | 10/2000 | Huang | 438/629 |
| 6,150,213 A | * 11/2000 | Luo et al. | 257/400 |
| 6,168,984 B1 | * 1/2001 | Yoo et al. | 438/239 |
| 6,180,453 B1 | * 1/2001 | Sung et al. | 438/256 |
| 6,184,081 B1 | * 2/2001 | Jeng et al. | 438/239 |
| 6,300,191 B1 | * 10/2001 | Yu et al. | 438/253 |
| 2001/0021122 A1 | * 9/2001 | Kurth et al. | 365/149 |
| 2002/0024083 A1 | * 2/2002 | Noble et al. | 257/306 |
| 2002/0030211 A1 | * 3/2002 | Keeth et al. | 257/296 |

* cited by examiner

Primary Examiner—Michael S. Lebentritt
(74) Attorney, Agent, or Firm—George O. Saile; Stephen B. Ackerman

(57) ABSTRACT

A method is described for making capacitor-under-bit line (CUB) DRAM cells with improved overlay margins between bit lines and capacitor top electrodes. After forming FETs for the memory cells, an interpolysilicon oxide (IPO) layer is deposited, and first and second plug contacts are formed in the IPO to the FET source/drain areas for capacitors and bit line contacts, respectively. A capacitor node oxide is deposited, and first openings are etched in which crown capacitor bottom electrodes are formed. After etching back the node oxide a thin interelectrode dielectric layer is formed and a conformal conducting layer is deposited to form capacitor top electrodes. A photoresist mask is used to etch openings in the conducting layer over the second plug contacts, and an isotropic etch is used to recess the openings under the mask to increase the spacing between the capacitor top electrodes and the bit line contacts to improve the overlay margin. The photoresist mask is removed and an interlevel dielectric (ILD) layer is deposited. Bit-line contact openings are etched in the ILD layer aligned over the recessed openings and in the node oxide to the second contact plugs. Bit-line contact plugs are formed extending through the recessed openings, and a first conducting layer is deposited and patterned to form bit lines and to complete the memory cells for the DRAM.

18 Claims, 3 Drawing Sheets

METHOD FOR IMPROVING BIT LINE TO CAPACITOR ELECTRICAL FAILURES ON DRAM CIRCUITS USING A WET ETCH-BACK TO IMPROVE THE BIT-LINE-TO-CAPACITOR OVERLAY MARGINS

BACKGROUND OF THE INVENTION (1) Field of the Invention

The present invention relates to a process for making capacitor-under-bit-line devices having increased memory cell density, and more specifically the process employs a selective wet etch-back of portions of the top capacitor electrode (also referred to as cell plate) between adjacent capacitors. This etch-back increases the overlay margins of the bit-line contacts to the capacitors to reduce electrical shorts and allows the capacitors to be spaced closer to each other for increased memory cell density.

(2) Description of the Prior Art

Dynamic random access memory (DRAM) circuits are used extensively in the electronics industry for storing date. The DRAM circuit includes an array of memory cells, each cell consisting of a single capacitor and a single transfer transistor. Typically the transfer transistor is a field effect transistor (FET). Binary data (1's and 0's ) are stored as charge on the capacitors, and the transfer transistor is used to retain the charge. During the read cycle the transfer transistor is used to interrogate the cell by means of bit lines. Two types of memory cells that are commonly used include a cell having a trench capacitor formed in the substrate under the PETs, and a cell having a stacked capacitor that is built over and between FETs. In the fabrication of DRAM circuits having stacked capacitors, the capacitor can be formed over the bit lines, commonly referred to as Capacitors-Over-Bit-lines (COB), or under the bit lines,.commonly referred to as Capacitors-Under-Bit lines (CUB). For all of the DRAM structures described above, the number of memory cells on a DRAM chip has increased dramatically over the years, and after the year 2000 the number of cells is expected to exceed 1 Gigabit. This increase is a result of the downsizing of the discrete devices using improved high-resolution photolithography, improved directional plasma etching, and self-aligning techniques, with a resulting increase in circuit density.

Numerous approaches to making these high-density circuits have been reported in the literature. For example, in U.S. Pat. No. 6,077,738 to Lee et al. a method is described for making DRAM devices (chips) which provides a global planar surface over the peripheral areas of the chip by using a thin silicon nitride layer. In U.S. Pat. No. 6,004,857 to Hsiao et al. a method is described for making a DRAM capacitor with a rough surface on the storage node plate (capacitor bottom electrode) for increased capacitance. In U.S. Pat. No. 6,127,260 to Hung a method is described for making tee-shaped contact openings to reduce the high aspect ratio on embedded DRAM devices. And in U. S. Pat. No. 5,893,734 to Jeng et al. a method is described for making multilevel contacts using a tungsten landing plug contact on CUB DRAM devices. However, none of the above cited references addresses the need to increase cell density by improving the overlay margins.

Although downscaling of devices and self-aligning techniques have dramatically increased the memory cell density on DRAM chips, there is still a strong need in the industry to further improve the reliability and further increase the cell density by other means. For example, it is highly desirable to further increase reliability by improving the overlay margins at various processing steps during the manufacture of DRAM circuits, and more particularly by increasing the overlay margin between the capacitors and the bit-line contacts.

SUMMARY OF THE INVENTION

A principal object of the present invention is to form an array of closely spaced dynamic random access memory (DRAM) cells, with reduced capacitor-to-bit-line shorts and increased cell density, for Capacitor-Under-Bit line (CUB) DRAM circuits.

Another object of this invention is to form these closely spaced memory cells by improving the overlay margin between the bit-line contact and the capacitor top electrode (capacitor cell plate).

Still another objective of this invention is to utilize a selective wet etch-back of portions of the polysilicon capacitor top electrode between adjacent capacitors to provide additional space for reducing the required overlay margin between the bit-line contact and the capacitor top electrode.

In accordance with the present invention, a method is described for making an array of crown-shaped capacitors under bit lines that have an improved overlay margin between the bit-line contacts and the capacitor top electrodes. The method for making the array of memory cells begins by providing a semiconductor substrate having partially completed DRAM devices. Typically the substrate is a single-crystal-silicon substrate doped with a P type conductive dopant, such as boron (B). Shallow trench isolation (STI) regions are formed surrounding and electrically isolating an array of device areas for memory cells on the substrate. The STI is formed by etching shallow trenches in the substrate, and the trenches are filled with an insulating material, such as silicon oxide ($SiO_x$) and is polished back to a planar surface. The partially completed DRAMs also include field effect transistors (FETs) in the device areas. Typically the FETs consist of a thin gate oxide on the device areas, and gate electrodes formed from a patterned polycide layer. The FETs also have source/drain areas, one on each side and adjacent to the FET gate electrodes.

Continuing, a relatively thin conformal silicon nitride ($Si_3N_4$) barrier layer is formed over the device areas and over the STI regions to insulate the FET devices on the DRAM circuit. An interpolysilicon oxide (IPO) layer is deposited on the substrate, and conducting first and second plug contacts are formed concurrently in the IPO layer to contact the source/drain areas of the FETs. The conducting first plug contacts extend through the IPO layer to the first source/drain areas for capacitors, and the conducting second plug contacts extend through the IPO layer to the second source/drain areas for bit-line contacts. A capacitor-node oxide layer is deposited, and first openings are formed in the capacitor-node oxide layer aligned over the first conducting plug contacts. Capacitor bottom electrodes are formed in the first openings aligned over and contacting the first conducting plug contacts. For example, the bottom electrodes are formed by depositing a conformal conductively doped polysilicon layer over the first openings and polishing back. The capacitor-node oxide layer is then partially etched back to expose the top portions of the capacitor bottom electrodes. Additionally, a hemispherical silicon grain (HSG) layer can be formed on the bottom electrodes to increase the surface area for increased capacitance. A conformal interelectrode dielectric layer is formed on the substrate and over the bottom electrodes. A conformal conducting layer, such as a doped polysilicon, is then deposited to form capacitor top electrodes. Next a patterned photoresist mask and anisotropic etching are used to etch openings in the conformal conducting layer, aligned over the second conducting plug contacts. A key feature of the invention is now to use an isotropic etch to recess (selectively etch) the conformal conducting layer (capacitor top electrodes) under the photoresist mask to increase the critical dimensions for the second openings (bit-line openings), and then the patterned photoresist mask is removed. An interlevel dielectric (ILD) layer is deposited on the substrate. Bit-line contact openings are etched in the ILD layer aligned over and within the recessed (enlarged) openings in the conducting layer. The etching is continued through the capacitor-node oxide layer to the second plug contacts. The enlarged recessed openings in the conformal conducting layer result in increased alignment tolerances for improved electrical isolation margin between the capacitor top electrodes and the bit-line contacts. This provides greater design latitude in the ground rules and also allows for increased memory cell density. Bit-line conducting plugs are formed in the bit-line contact openings to the second conducting plug contacts. A second conducting layer is deposited and patterned to form bit lines to complete the array of DRAM cells. The DRAM device can then be completed using conventional processing.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making crown-shaped capacitors with improved overlay margins for DRAM devices is now described in detail. The invention utilizes a wet etch-back of the portions of the polysilicon capacitor top electrode (or cell plate) between adjacent capacitors to provide additional space for aligning the bit-line contact mask. This provides additional overlay margin between the bit-line contact and the capacitor top electrode to reduce electrical shorts and allows for tighter ground rules to be used for increased memory cell density.

Although the method is described for making crown-shaped capacitors on memory cells having N-channel FETs, it should also be well understood by one skilled in the art that by including additional process step, in addition to those described in the embodiment, other types of devices can also be included on the DRAM chip. For example, by forming N-well regions in a P doped substrate, P-channel FETs can also be provided to form Complementary Metal-Oxide-Semiconductor (CMOS) circuits, such as required for the peripheral circuits on the DRAM chip.

Figure 1:
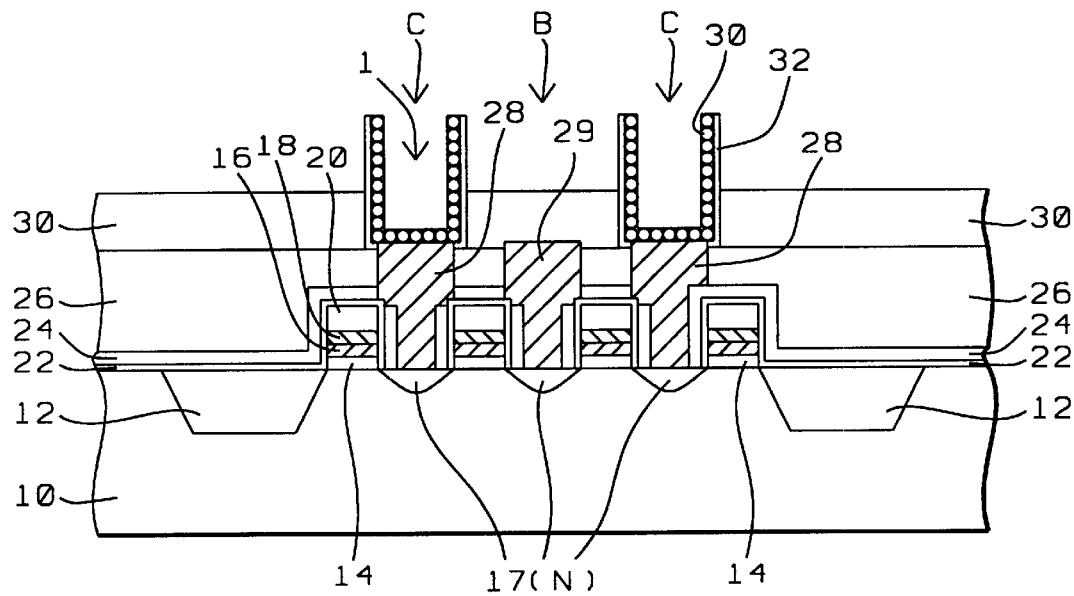
FIGS. 1–6 show schematic cross-sectional views for the sequence of process steps for making a capacitor-under-bit-line (CUB) DRAM cell with improved overlay margin between the bit lines and capacitor top electrodes.

Referring now to FIG. 1, a schematic cross-sectional view of a portion of a semiconductor substrate 10 is shown having partially completed DRAM cells. These partially completed DRAM cells are described only briefly since they are not essential for describing the novel features of this invention. Typically the substrate 10 is composed of a lightly doped P type single-crystal silicon having a <100> crystallographic orientation and having an array of memory cell areas surrounded and electrically isolated by shallow trench isolation (STI) regions 12. The cross section through the DRAM cell area shows a series of closely spaced N-channel FET gate electrodes in which two adjacent capacitors C share a common bit-line contact B. The FETs are formed by first forming a gate oxide 14 on the device areas. Next a stacked layer of doped polysilicon 16, a silicide layer 18, and a cap oxide layer 20 are deposited and patterned to form the FET gate electrodes. Source/drain contact areas 17(N) are formed in the substrate 10 adjacent to the FET gate electrodes (16,18) by ion implantation of a N type dopant, such as arsenic or phosphorous.

Still referring to FIG. 1, a thin conformal stressrelease silicon oxide ($SiO_2$) layer 22, and a silicon nitride ($Si_3N_4$) layer 24 are deposited on the substrate over the FETs to form a liner/barrier layer. Typically layer 22 is deposited by LPCVD to a thickness of between about 100 and 200 Angstroms and the liner 24 is deposited by LPCVD to a thickness of between about 300 and 600 Angstroms.

Still referring to FIG. 1, an interpolysilicon oxide (IPO) layer 26 is deposited over the FETs on the substrate and is planarized. The IPO layer 26 is typically $SiO_2$ deposited by LPCVD using tetraethosiloxane (TEOS) as the reactant gas. Alternatively dopants such as boron and phosphorus can be added to layer 26 during deposition to form a borophosphosilicate glass (BPSG). The IPO layer 26 is then planarized, for example, by chemical-mechanical polishing to leave a thickness of between about 3000 and 5000 Angstroms over the FET devices.

Next conventional photolithographic techniques and anisotropic plasma etching are used to etch the first self-aligned contact (SAC) openings to the source/drain areas 17(N) for capacitor nodes, and second self-aligned contact openings for the shared bit-line contacts. A conducting layer is deposited and polished back to concurrently fill the contact openings to form first conducting plugs 28 for capacitors and second plug contacts 29 for the bit lines. Preferably the conducting layer is an N doped polysilicon layer and is deposited by LPCVD using a reactant gas containing silane ($SiH_4$) or dichlorosilane ($SiCl_2H_2$), and is deposited to a thickness sufficient to fill the openings. Continuing with the process, as shown in FIG. 1, a capacitor-node oxide layer 30 is deposited, and first openings 1 are formed in the capacitor-node oxide layer 30 aligned over the first conducting plug contacts 28. Preferably the node oxide layer 30 is also $SiO_2$ and is deposited by LPCVD using TEOS as the reactant gas. The node oxide layer defines the height of the capacitor bottom electrodes and is preferably deposited to a thickness determined by circuit design, but more specifically to a thickness of between about 15000 and 20000 Angstroms. The contact openings 1 are etched using conventional photolithographic techniques and the capacitor bottom electrodes 32 are formed in the first openings 1 aligned over and contacting the first conducting plug contacts 28. For example, one method of forming the bottom electrodes is to deposit a conformal conductively doped polysilicon layer over the first openings and chemically-mechanically polishing back to form the bottom electrodes 32. The capacitor-node oxide layer 30 is then partially and selectively etched back to expose the top portions of the capacitor bottom electrodes 32 for the crowned capacitors C. To further increase the capacitance an optional hemispherical silicon grain (HSG) layer 33 can be formed on the bottom electrodes 32 to increase the surface area.

Figure 2:
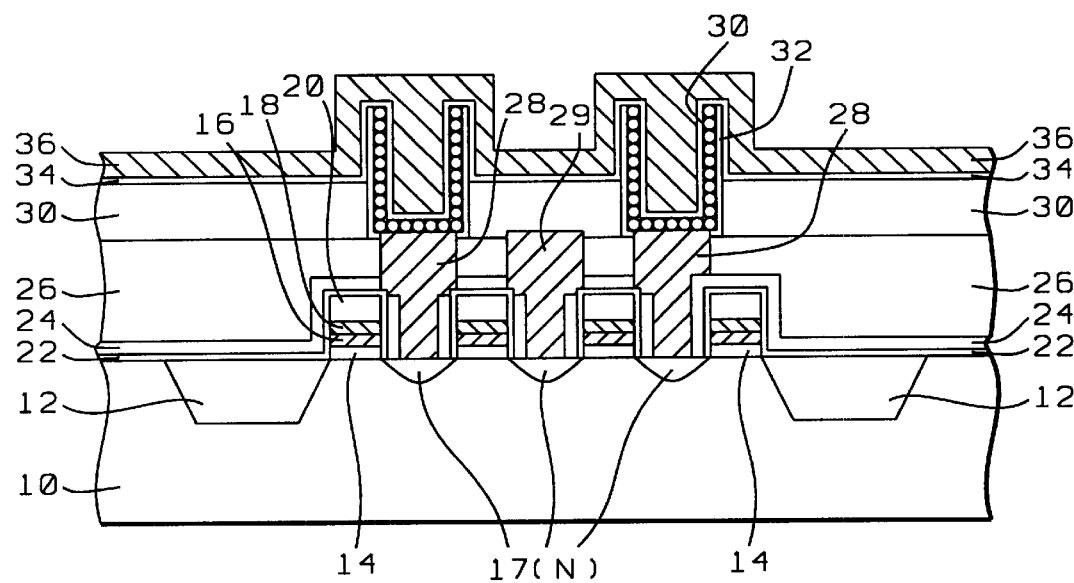

Referring to FIG. 2, a conformal interelectrode dielectric layer 34 is formed on the substrate and over the bottom electrodes 32. Typically layer 34 is a high-dielectric-constant material and is very thin and pin-hole free. For example, a $SiO_2$—$Si_3N_4$, commonly referred to as ON, can be used, or a layer of $SiO_2$—$Si_3N_4$—$SiO_2$ (ONO) can be used. The ONO, for example, can be formed by oxidizing the bottom electrode and depositing a $Si_3N_4$ layer which is subsequently partially oxidized in an oxygen ambient. Layer 34 is typically formed to a thickness of between about 40 and 60 Angstroms. Other more exotic high-k materials, such as tantalum pentoxide ($Ta_2O_5$), can also be used.

The capacitor top electrode 36 (or capacitor plate) is formed next by depositing a conformal conducting layer 36. Layer 36 is preferably a polysilicon layer but the invention is not limited to polysilicon. The polysilicon layer 36 is preferably deposited by LPCVD using $SiH_4$ of $SiCl_2H_2$ as the reactant gas and the polysilicon is deposited to a preferred thickness of between about 500 and 1500 Angstroms.

Figure 3:
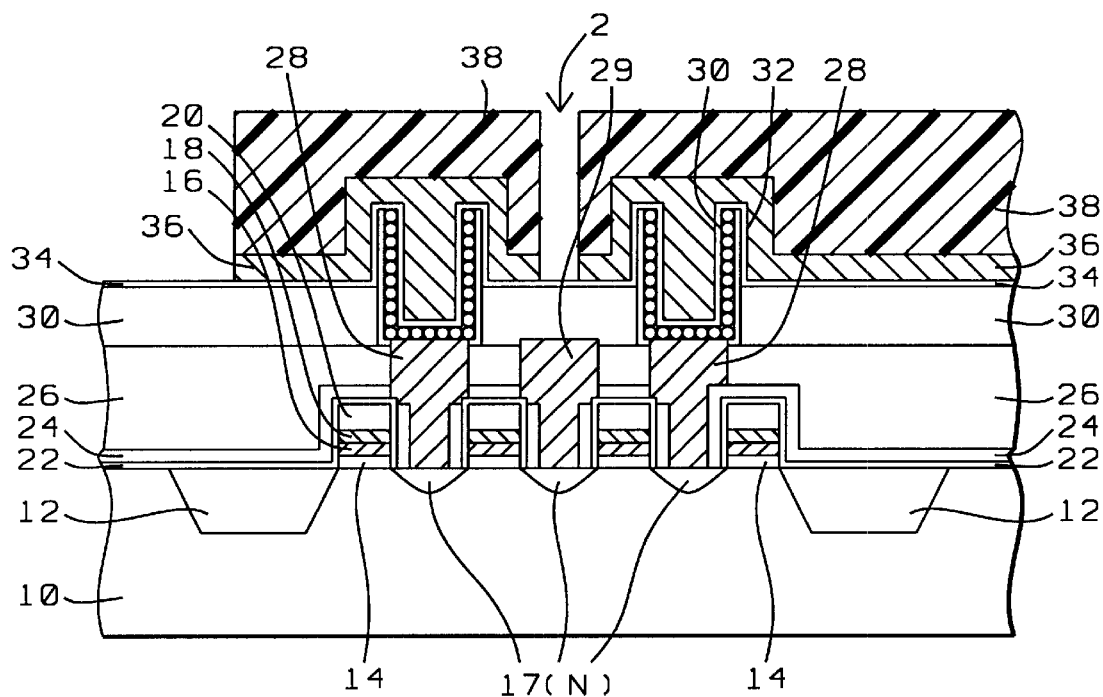

Referring next to FIG. 3, a photoresist layer 38 is deposited by spin coating and is patterned by conventional photolithographic techniques to form openings 2 in the photoresist aligned over the bit line contacts 29. An anisotropic plasma etch is then used to etch openings 2' in the top electrode 36 over the bit-line contacts 29. The photoresist mask 38 is also patterned to form the top electrode plate 36, as depicted in FIG. 3 by E at the capacitor plate edge. The polysilicon layer 36 is preferably etched using reactive ion etching (RIE) or a high-density plasma (HDP) etcher and a selective etchant gas containing a chlorine (Cl) species and a carrier gas such as argon.

Figure 4:
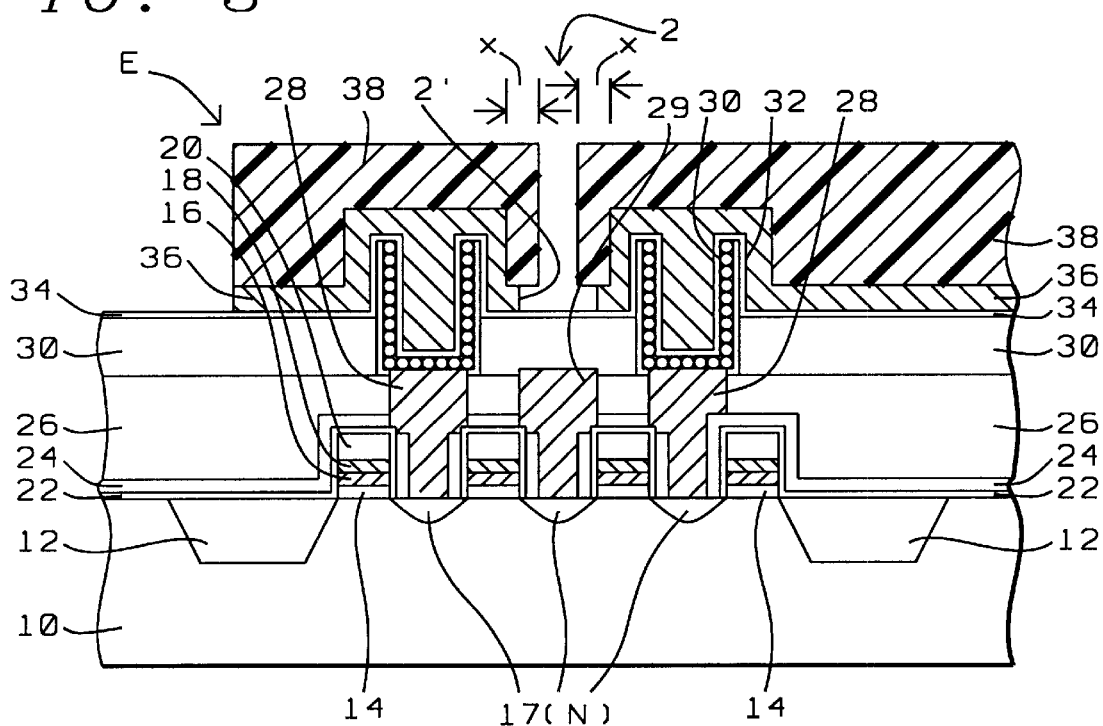

Referring to FIG. 4, a key feature of the invention is to use an isotropic etch to recess (selectively etch) the conformal conducting layer 36 (capacitor top electrode). The photoresist mask 38 is used to protect the top surface of layer 36 while the exposed edge of layer 36 is recessed to increase the critical dimensions of the second openings 2' (bit-line openings) by a distance of x. More specifically, the polysilicon is recessed using a wet etch, such as $NH_4OH$ or $HNO_3$ and HF. The distance x of the recess depends on the circuit requirements, but would typically be between about 0.15 and 0.30 micrometers.

Figure 5:
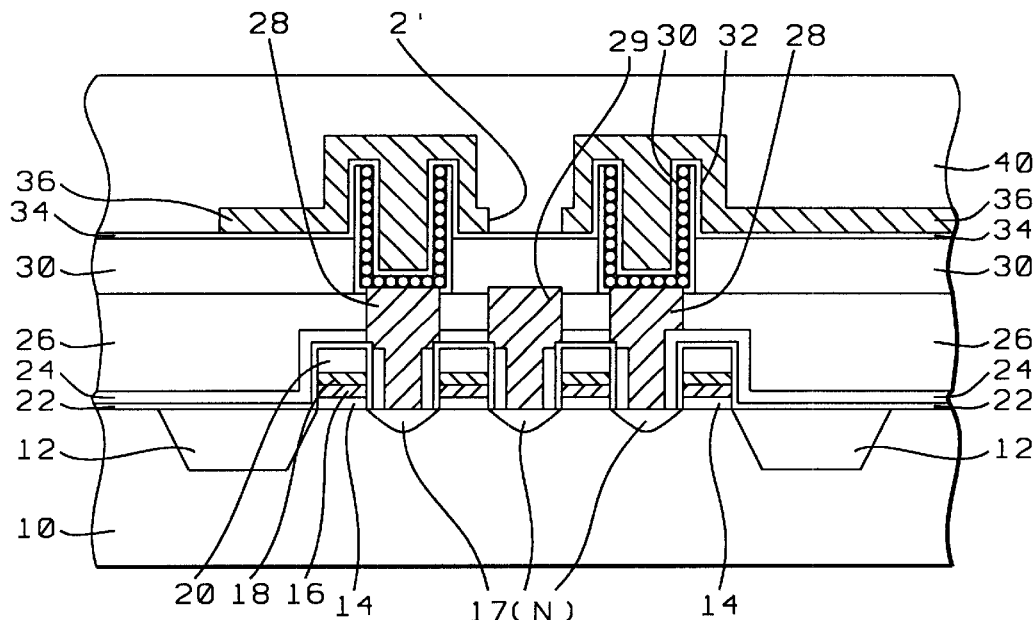
Figure 6:
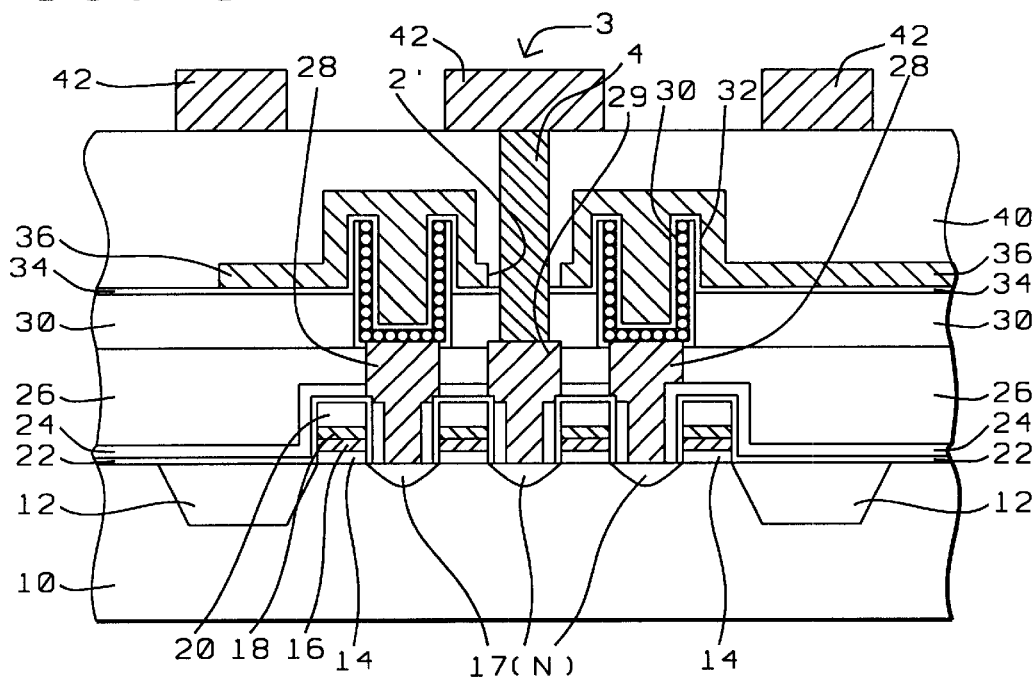

Referring to FIG. 5, the photoresist 38 is removed, for example, by plasma ashing in oxygen and an interlevel dielectric (ILD) layer 40 is deposited on the substrate. The ILD layer 40 is composed of a layer of $SiO_2$ and BPSG, deposited by LPCVD using a reactant gas such as TEOS, and adding boron and phosphorus dopants to form the BPSG. Layer 40 is deposited and planarized to have a thickness of between about 3500 and 5000 Angstroms over the capacitor cell plate 36 on the top of the crown capacitor. Also as shown in FIG. 5, bit-line contact openings 3 are etched in the ILD layer 40 aligned over and within the recessed (enlarged) openings 2' in the conducting layer 36. The etching is continued through the inter-electrode dielectric layer 34 and the capacitor-node oxide layer 30 to the second plug contacts 29. The recessed openings 2' in the conformal conducting layer 36 result in increased alignment tolerances for improved electrical isolation margin between the capacitor top electrodes 36 and the bit-line contact openings 3. This provides greater design latitude in the ground rules and also allows for increased memory cell density. Bit-line conducting plugs 4 are formed in the bit-line contact openings 3 to the second conducting plug contacts 29. The bit-line conducting plugs 4 are preferably formed by depositing tungsten (W) by physical vapor deposition or by CVD deposition using $WF_6$ as the reactant gas, and polished or etched back to the top surface of the ILD layer 40. The bit lines are formed by depositing a second conducting layer 42 which is patterned to form bit lines 42. Preferably layer 42 is a titanium (Ti) barrier/adhesion layer and an aluminum-copper (AlCu) layer, and is deposited by physical vapor deposition, such as by sputter deposition. The DRAM device can then be completed using conventional processing.

While the invention has been particularly shown and described with reference to the preferred embodiment thereof, it will be understood by those skilled in the art that various changes in form and details may be made without departing from the spirit and scope of the invention.

What is claimed is:

1. An improved process for fabricating an array of memory cells on a dynamic random access memory (DRAM) device comprising the steps of:

providing a semiconductor substrate having partially completed DRAM devices consisting of an array of device areas surrounded and electrically isolated by field oxide regions, each of said device areas having field effect transistors with gate electrodes and first and second source/drain areas having first and second plug contacts, respectively, said plug contacts extending upward through an interpolysilicon oxide (IPO) layer;

forming crown capacitors on said substrate electrically contacting said first plug contacts;

forming a blanket conformal conducting layer over said capacitors for capacitor top electrodes;

using a patterned photoresist mask and anisotropically etching to pattern said conducting layer and forming openings in said conformal conducting layer aligned over said second plug contacts; and further, recessing said openings in said conformal conducting layer under said photoresist mask by isotropic etching to increase critical dimensions for bit-line openings;

removing said photoresist mask;

depositing an interlevel dielectric layer on said substrate and etching bit-line contact openings in said interlevel dielectric layer aligned over and within said openings in said conducting layer, and further etching to said second plug contacts, wherein said recessed openings in said conformal conducting layer improves the isolation margin between said capacitor top electrodes and said bit-line contact openings;

forming bit-line contact plugs in said bit-line contact openings to said second plug contacts and depositing and patterning a second conducting layer to form bit lines to complete said array of memory cells.

2. The method of claim 1, wherein said inter-polysilicon oxide layer is composed of borophospho-silicate glass and is deposited to a thickness of between about 3000 and 3500 Angstroms.

3. The method of claim 1, wherein said plug contacts are composed of polysilicon and are doped N type to a concentration of between about 1.0 E 20 and 1.0 E 22 atoms/$cm^3$.

4. The method of claim 1, wherein said capacitor top electrodes are composed of polysilicon and are conductively doped with phosphorus to a concentration of between about 1.0 E 20 and 1.0 E 22 atoms/$cm^3$.

5. The method of claim 1, wherein said capacitor top electrodes are formed to a thickness of between about 500 and 1500 Angstroms.

6. The method of claim 1, wherein said interlevel dielectric layer is composed of a silicon oxide layer and a BPSG layer deposited by LPCVD to a thickness of between about 3500 and 5000 Angstroms.

7. The method of claim 1, wherein said conformal conducting layer is recessed by wet etching in a solution of $NH_4OH$.

8. The method of claim 1, wherein said conformal conducting layer is recessed by wet etching in a solution of $HNO_3$ and HF.

9. An improved process for fabricating an array of memory cells on a dynamic random access memory (DRAM) device comprising the steps of:

providing a semiconductor substrate having partially completed DRAM devices consisting of an array of device areas surrounded and electrically isolated by field oxide regions, each of said device areas having field effect transistors with gate electrodes and first and second source/drain areas;

depositing an interpolysilicon oxide (IPO) layer on said substrate and forming conducting first and second plug contacts, said first plug contacts extending through said IPO layer to said first source/drain areas for capacitors, and said second plug contacts extending through said IPO layer to said second source/drain areas for bit-line contacts;

depositing a capacitor-node oxide layer and forming first openings in said capacitor-node oxide layer aligned over said first plug contacts;

forming capacitor bottom electrodes in said first openings aligned over and contacting said first plug contacts;

partially etching back said capacitor-node oxide layer to expose top portions of said bottom electrodes;

forming a conformal interelectrode dielectric layer on said substrate and over said bottom electrodes;

depositing a conformal conducting layer to form capacitor top electrodes;

using a patterned photoresist mask and anisotropically etching second openings in said conformal conducting layer aligned over said second plug contacts; and further, recessing said second openings in said conformal conducting layer under said photoresist mask by isotropic etching to increase critical dimensions for bit-line contact openings;

removing said photoresist mask;

depositing an interlevel dielectric layer on said substrate and etching said bit-line contact openings in said interlevel dielectric layer aligned over and within said second openings in said conducting layer, and further etching through said capacitor-node oxide layer, wherein said recessed openings in said conformal conducting layer improves the isolation margin between said capacitor top electrodes and said bit-line contact openings;

forming a conducting plug in said bit-line contact openings to said second plug contacts and depositing and patterning a second conducting layer to form bit lines to complete said array of memory cells.

10. The method of claim 9, wherein said inter-polysilicon oxide layer is composed of BPSG and is deposited to a thickness of between about 3000 and 5000 Angstroms.

11. The method of claim 9, wherein said electrically conducting plug contacts are composed of polysilicon and are doped N type to a concentration of between about $1.0 \text{ E } 20$ and $1.0 \text{ E } 22$ atoms/cm$^3$.

12. The method of claim 9, wherein said capacitor-node oxide is $SiO_2$ and is deposited to a thickness of between abut 15000 and 20000 Angstroms.

13. The method of claim 9, wherein said capacitor bottom electrodes and said capacitor top electrodes are composed of polysilicon and are conductively doped with phosphorus to a concentration of between about $1.0 \text{ E } 20$ and $1.0 \text{ E } 22$ atoms/cm$^3$.

14. The method of claim 9, wherein said capacitor top electrodes are deposited to a thickness of between about 500 and 1500 Angstroms.

15. The method of claim 9, wherein said inter-electrode dielectric layer is silicon oxide/silicon nitride/silicon oxide and has a thickness of between about 40 and 60 Angstroms.

16. The method of claim 9, wherein said interlevel dielectric layer is composed of a $SiO_2$ layer and a BPSG layer, deposited by LPCVD to a thickness of between about 3500 and 5000 Angstroms.

17. The method of claim 9, wherein said conformal conducting layer is recessed by wet etching in a solution of $NH_4OH$.

18. The method of claim 9, wherein said conformal conducting layer is recessed by wet etching in a solution of $HNO_3$ and HF.

* * * * *